(12) United States Patent
Sampayan

(10) Patent No.: US 9,142,339 B2
(45) Date of Patent: Sep. 22, 2015

(54) COMPACT OPTICAL TRANSCONDUCTANCE VARISTOR

(71) Applicant: Stephen Sampayan, Manteca, CA (US)

(72) Inventor: Stephen Sampayan, Manteca, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 197 days.

(21) Appl. No.: 13/928,322

(22) Filed: Jun. 26, 2013

(65) Prior Publication Data

US 2013/0342306 A1    Dec. 26, 2013

Related U.S. Application Data

(60) Provisional application No. 61/664,649, filed on Jun. 26, 2012.

(51) Int. Cl.
| H01L 31/08 | (2006.01) |
| H01C 1/00 | (2006.01) |
| H01C 7/10 | (2006.01) |
| H01L 27/08 | (2006.01) |
| H01L 29/93 | (2006.01) |

(52) U.S. Cl.
CPC ............... *H01C 1/00* (2013.01); *H01C 7/1013* (2013.01); *H01L 27/0808* (2013.01); *H01L 29/93* (2013.01)

(58) Field of Classification Search
CPC . H01L 31/0224; H01L 31/09; H01L 27/0808; H01L 29/93; H01C 7/1013; H01C 1/00; G02B 1/005; G02B 2006/12145; G02B 6/1225; G02B 6/3596
USPC .................................................. 338/15, 13, 18
See application file for complete search history.

(56) References Cited

U.S. PATENT DOCUMENTS

| 4,691,111 | A | * | 9/1987 | Bovino | 250/551 |
| 4,695,733 | A | * | 9/1987 | Pesavento | 250/551 |
| 5,047,623 | A | * | 9/1991 | Wilcox | 250/214.1 |
| 5,369,283 | A | * | 11/1994 | Vogel et al. | 250/551 |
| 5,773,817 | A | * | 6/1998 | Kingsley et al. | 250/214.1 |
| 6,759,668 | B2 | * | 7/2004 | Matsuo et al. | 250/551 |
| 8,258,632 | B1 | * | 9/2012 | Sullivan et al. | 257/778 |
| 8,455,328 | B2 | * | 6/2013 | Mazzola | 438/403 |
| 2013/0328146 | A1 | * | 12/2013 | Nelson | 257/432 |
| 2013/0342306 | A1 | * | 12/2013 | Sampayan | 338/15 |

* cited by examiner

*Primary Examiner* — Kyung Lee
(74) *Attorney, Agent, or Firm* — James S. Tak

(57) ABSTRACT

A compact radiation-modulated transconductance varistor device having both a radiation source and a photoconductive wide bandgap semiconductor material (PWBSM) integrally formed on a substrate so that a single interface is formed between the radiation source and PWBSM for transmitting PWBSM activation radiation directly from the radiation source to the PWBSM.

6 Claims, 6 Drawing Sheets

COMPACT OPTICAL TRANSCONDUCTANCE VARISTOR

CLAIM OF PRIORITY IN PROVISIONAL APPLICATION

This patent document claims the benefit and priority of U.S. Provisional Application No. 61/664,649, filed on Jun. 26, 2012, hereby incorporated by reference.

FEDERALLY SPONSORED RESEARCH OR DEVELOPMENT

The United States Government has rights in this invention pursuant to Contract No. DE-AC52-07NA27344 between the United States Department of Energy and Lawrence Livermore National Security, LLC for the operation of Lawrence Livermore National Laboratory.

TECHNICAL FIELD

This patent document relates to photoconductive devices and in particular to a compact radiation-controlled (e.g. optically controlled) transconductance varistor having both a wide bandgap semiconductor (WBS) material and a radiation source formed on a common substrate and abutted against each other to form a radiation source-to-WBS interface across which radiation from the radiation source may be transmitted directly into the WBS material.

BACKGROUND

Limited voltage capability of junction devices, such as diodes and transistors, is known, resulting from most of the applied voltage being confined to the very thin region on either side of the junction. This region is commonly referred to as the depletion region and is identified as the "space charge region" illustrated in FIG. 1. The thickness of this region is governed by many of the physics processes occurring in the device and can generally be only microns thick for most doping amounts. As a result, very little voltage divides across the bulk of the device (e.g., the thick vertical lines on the left extreme of the p-doped and the right extreme of the n-doped regions below). This effect is shown in the schematically represented voltage curve in FIG. 1. Thus the volume between the depletion region boundaries and the electrodes (labeled "neutral region") are largely useless in increasing the amount of voltage that can be applied to the overall device. For junction devices made from GaN and SiC, this breakdown can occur in the range of 400 to 4,000 V across the device.

Wide bandgap semiconductor (WBS) materials are also known, e.g. GaN, SiC, etc., which when illuminated, irradiated, or otherwise energized by a radiation source of photons or subatomic particles, renders the material conductive, and may therefore be used, for example, as a photoconductive switch. Typically, the optical transport used to transport the radiation from the radiation source (e.g. a laser) to the WBS material is either through "free space" or an intermediate optical conduit, e.g. fiber optic cables, as illustrated in FIG. 2. In the case of optical conduits, however, at least two additional optical surfaces are required between the radiation source and the WBS: one additional surface (i.e. first optical conduit surface) forming the interface between the radiation source and the optical conduit, and another additional surface (i.e. second optical conduit surface) forming the interface between the optical conduit and the WBS. Each optical surface can contribute about 4% loss, and these loses, termed Fresnel losses, functionally follow a power multiplier. That is:

Total Transmitted Energy=(Initial Energy)(1-fractional loss at each interface)$^{Total\ Interfaces}$ Thus for two interfaces as in the above example, only 92% of the initial energy from the optical source is transmitted to the substrate. Because the optical source can be highly inefficient (typically only about 10% efficiency in the best cases, but more typically 1% efficiency), any lost optical energy substantially impacts the overall system.

Furthermore, radiation sources such as optical sources have a certain amount of beam divergence and the acceptance of the optical conduit (e.g. fiber) is generally much less than that divergence. In addition, the divergence exiting the fiber is very large and some energy can be lost at the interface between the optical conduit and the WBS material due to this divergence. To overcome this loss requires the addition of lenses between the radiation source-to-optical conduit interface and the optical conduit-to-WBS interface. Unfortunately, each lens used introduces two interfaces per lens. So then in this example, only 78% of the initial energy from the optical source is transmitted to the substrate. While these loses can be reduced with special coatings at each interface, this technique can introduce added complexity and cost to the overall device. In addition to these losses, the added length of the optical conduit/fiber attenuates the optical energy resulting in more losses. And finally, the typical size of the output of the radiation source can be several square millimeters. And the WBS material can similarly be several square millimeters. The fiber, however, must be substantially less than those areas to maintain the mechanical flexibility. Thus, because the energy from the optical source must be concentrated into the fiber, the surface can be easily burned or damaged.

Electrically, the control/modulation of the WBS is functionally dependent on the capacitance of the overall device. But for a system, the desire is to minimize the number of optical feeds. Thus each switch must be fairly large in extent to minimize the number of optical feeds. As a result, each switch is highly capacitive. This capacitance adversely impacts the range in high frequencies that can be achieved. One method of minimizing this problem is to use a distributed capacitive system, such as shown in FIG. 3, having multiple optically triggered switches, in place of a lumped capacitive system having a single switch, in a circuit to drive a load (e.g. an antenna). The distributed capacitive system would produce a better frequency response due to reduced switch capacitance. Thus the useful range of frequencies can be extended by using a distributed system. However, one difficulty with such a distributed capacitive system is the complexity of multiple optical fibers being used to transmit the optical energy from the radiation source. For instance, a multiple fiber bundle would be required connected with specific outputs to connect the radiation source at point A to each switch so that the electrical delay from each of the distributed switches $S_A, S_B, \ldots$ and $S_C$ to point B is exactly compensates by the optical delay. The objective in such an arrangement is an equal delay from point A to point B through any switch $S_N$, which can be problematic.

Additionally, in many wide bandgap fabrication methods, the desired WBS substrate (e.g. gallium nitride, GaN) is by necessity grown on a supporting substrate. In the particular case of GaN, the supporting substrate can be either sapphire or silicon carbide. With such processes, after the desired material is of sufficient thickness is grown, it must be removed from the sapphire or silicon carbide by invasive techniques. One such technique is a laser lift-off technique where the laser is applied through the transparent gallium nitride causing rapid heating at the gallium nitride and sapphire or silicon carbide interface. However, spalling and fracture may then occur at the boundary to enable the deposited gallium nitride to be removed. Such processes can generate defects and result in eventual failure of the gallium nitride under modulation conditions.

SUMMARY

In one example implementation, a radiation-controlled transconductance varistor is provided comprising: a substrate; a wide bandgap semiconductor (WBS) material formed on the substrate between two electrodes; and a radiation source cable of being controlled by a source controller to produce radiation, said radiation source formed on the substrate adjacent the WBS material so that radiation from the radiation source is transmitted directly to the WBS material to control conductivity thereacross between said electrodes.

In another example implementation, an optically-controlled transconductance varistor comprising: a substrate; a wide bandgap semiconductor (WBS) material formed on the substrate between two electrodes; and an optical source cable of being controlled by a source controller to produce light, said optical source formed on the substrate adjacent the WBS material so that illumination from the optical source is transmitted directly to the WBS material to control conductivity thereacross between said electrodes.

These and other implementations and various features and operations are described in greater detail in the drawings, the description and the claims.

The device and approach of the present invention is directed to a compact, radiation-controlled transconductance varistor having a controlled radiation source (e.g. modulated optical source) and WBS material integrated together on a single substrate adjacent each other to transmit radiation from the radiation source directly to the WBS to control conductivity across the WBS. The WBS material may be, for example SiC, GaN, with two electrodes formed or otherwise connected to the WBS material. And the radiation source may be, for example, a laser or other optical source, a particle source (e.g. sub-atomic), x-ray source, etc. The radiation sources are preferably compact radiation sources, such as for example a very compact single laser of sufficient energy which are commercially available in very small packages. Furthermore, the radiation sources are arranged to be controllable by a source controller to produce the radiation. For example, a modulator may be used to modulate a laser or other light source as known in the art.

By optically exciting WBS in a compact package, the conductivity of the bulk material is controlled and modulated (e.g. with a modulator) and the entirety of the WBS crystal participates in the conduction process. For instance, a 100 micron thick SiC crystal will have the capability approaching 40 kV and would replace ten equivalent junction devices. Thus, unlike junction devices, the WBS material can be made arbitrarily thick to accommodate higher voltages in a single device. And it can be used, for example, as a high voltage junction/filed effect transistor replacement.

And by integrating the individual components of the controlled radiation source and the WMS into a single module, a simple three terminal device is produced, with the three terminals characterized as the controller input to the radiation source, one of the two electrodes as a common electrode, and the other one of the two electrodes being the output terminal. Because this device is similar to a "transconductance varistor," or more commonly called a "transistor," the device of the present invention is similarly characterized as a radiation-controlled transconductance varistor, and in the optical case in particular, an optical transconductance varistor, abbreviated as "opticondistor." In any case, these components would be integrated into a simple module without a view of the internal processes necessary to make the device functional. The radiation-controlled transconductance varistor or opticondistor of the present invention may be used as a high power building block in various systems of various applications. The integrated configuration allows reduction of the overall size of the integrated source and WBS assembly, potentially small enough to be constructed on a single printed circuit board.

The device may be particularly designed to activate the WBS material in a linear region, and thereby operate in the linear regime. As shown in FIG. 4, the typical behavior of wide bandgap material under the influence of radiation: On the x-axis is the intensity of the visible optical energy onto the GaN material. The resultant current flow is shown on the y-axis for multiple voltages applied across the material. Most work to date has concentrated on the extreme values of current through the material because of the application interest in "switching". Those extremes occur when the optical energy is essentially zero or when it is at a high value. It is evident that there is both a linear region and a saturation region as is with a typical transistor device. Thus, when the material is operated in the linear region, amplification of an applied modulation to the optical pulse will result in amplification of the applied signal. The optical source is shown generalized to be any radiation source of modulated photons or sub-atomic particles.

BRIEF DESCRIPTION OF THE DRAWINGS

The accompanying drawings, where are incorporated into and forma a part of the disclosure, are as follows.

DETAILED DESCRIPTION

Turning now to the drawings, various example embodiments of the present invention are shown. It is notable that although the electrodes are shown in a particular configuration, any other electrode configurations can be used without substantially affecting the overall functionality of the device. The only requirements for this functionality are a source of modulated or otherwise controlled radiation and the WBS material adjacent and in close proximity of the radiation source so as to intercept the majority of the created radiation. Further, the illustrations depict only the general technique and comparative scale sizes are used for clarity only.

Figure 1:
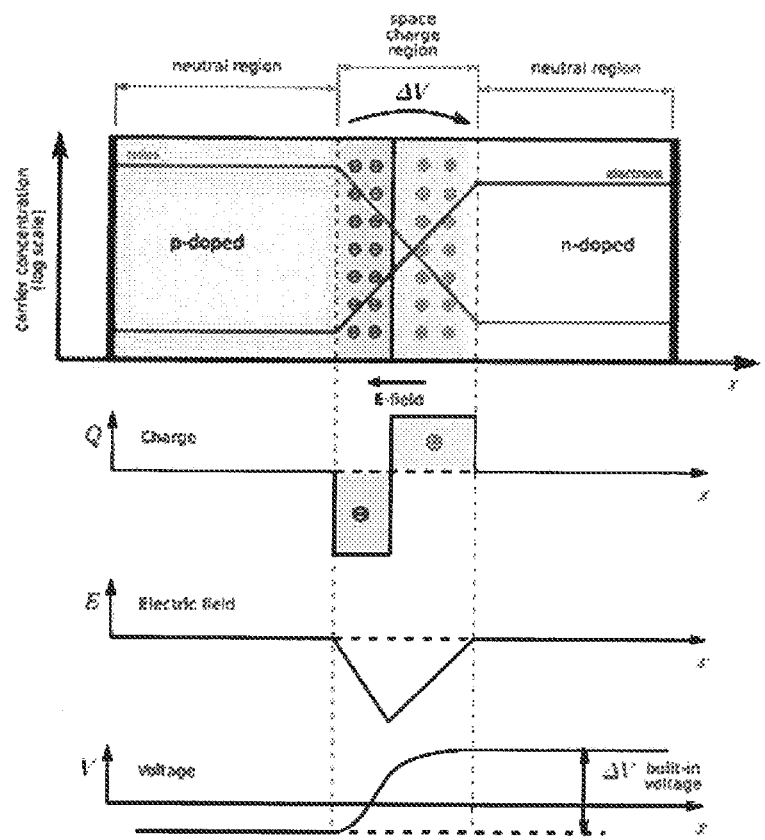
FIG. 1 is a schematic view of a conventional junction device and the narrow space charge region formed on either side of the junction, as well as associated charge, electric field, and voltage graphs across the space charge region.
Figure 2:
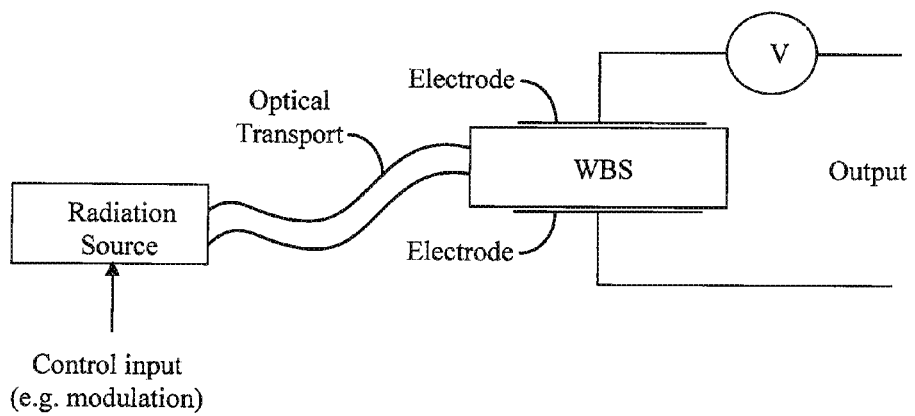
FIG. 2 is a schematic view of a typical photoconductive switch arrangement using an optical transport, such as an optic fiber, from the radiation source to the WBS.
Figure 3:
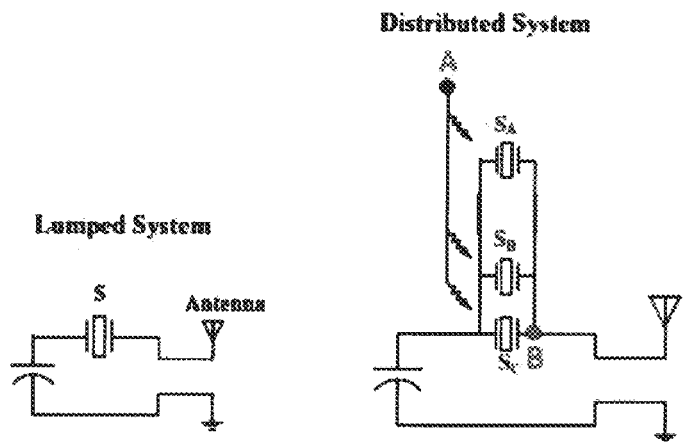
FIG. 3 is a schematic view of a lumped capacitive system and a distributed capacitive system.
Figure 4:
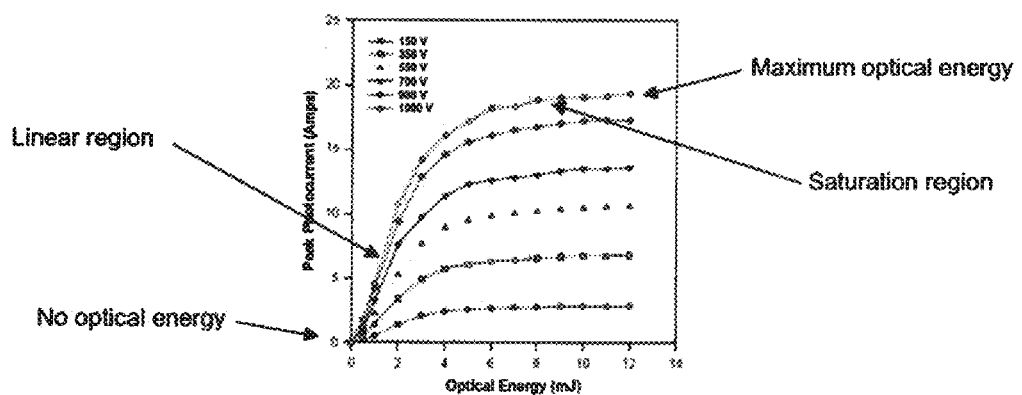
FIG. 4 is a graph showing the conduction response of a SiC material to optical energy at various voltage levels, and illustrating the substantially linear response of a non-saturated region.
Figure 5:
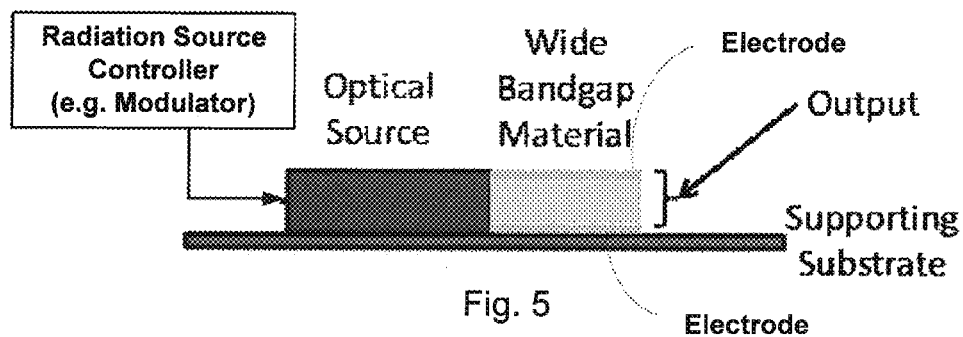
FIG. 5 is a first example embodiment of the opticondistor of the present invention.

FIG. 5 shows a first example embodiment of the opticondistor of the present invention having an optical source and WBS material integrated together on a supporting substrate. The WBS is shown having two electrodes arranged horizontally in parallel with and on opposite sides of the WBS substrate so that the radiation source is abutted against the WBS material. A radiation source controller, e.g. modulator, is also shown providing input to control activation of the optical source.

An example method of fabricating an opticondistor with GaN photoconductive material on a self-supporting wafer of SiC, with a horizontal electrode configuration, is described as follows. For such a structure in the horizontal pane, rather than using a conductive metal film, the local SiC material can be doped to provide electrical conduction beneath the GaN photoconductive material. Typically, the base SiC substrate could be doped very locally in this area by using well known standard photo resist techniques to control the area of conductivity. In this technique, a photosensitive material is applied to the surface of the SiC wafer. The regions where various features are required are first generated on a mask. Then by applying UV light (or other forms of radiation such as x-rays or an electron beam) to the wafer through the mask will develop some areas, but will leave other areas defined by the mask undeveloped.

Then, depending on the process, the developed regions, can be removed chemically by using reagents particularly reactive with the developed regions, but generally un-reactive with the undeveloped areas. The remaining areas of photoresist then act as a barrier to inhibit the processes designated for the areas where the photoresist is removed. For instance, the removed areas of photo resist can then be for ion-implanted to provide conductivity under the location where the wide bandgap material is to be deposited. Once the dopant deposited in the ion implanted area is activated, it will become conductive. This process would form the lower electrode.

To deposit the GaN photoconductive material, multiple processes can be used. These include Molecular Beam Epitaxy (see for instance M. J. Paisley, J. Vac Sci Technology A7(3) May/June 1989) which uses essentially a molecular beam Ga source directed at the substrate. With a glow discharge nitrogen plasma, GaN forms and impacts the SiC substrate surface. As the molecules impact the SiC substrate, they cool and attach themselves to the surface. Other techniques use a type of vapor transport (see for instance U.S. Pat. No. 7,897,490) and a chemical reaction to create the gallium nitride molecule which is subsequently deposited on the substrate surface. Since the GaN is self-adhering to the supporting wafer, only areas where the deposition is not required need be masked off with a similar photo resist technique as in the above.

And to build alternating layers of metal and GaN photoconductive material, as shown in FIGS. 7-11 only requires that a secondary molecular source of a highly conductive metal (such as gold) be used in conjunction with the apparatus. Thickness in each layer is then determined by the deposition time of each process. Alternatively, the conductive inner layers can be formed by doping the GaN intermittently during the process.

For the optical source, laser diodes of sufficient intensity can be used to illuminate the GaN photoconductive material. Such a laser diode may consist of multiple layers on a GaN substrate. Optical output is out of the page. This GaN substrate in this figure can again be deposited on a SiC substrate, but with an isolating trench between the GaN photoconductive material substrate and the GaN base for the laser diode. Such trenches can either be etched in placed or be filled with oxide or any suitable insulator. Again, by using the photoresist techniques previously mentioned, a 3d structure laser diode structure adjacent to the GaN photoconductive material can be used to control deposition of the proper materials.

As the input of the Opticondistor, control of the intensity of the laser diode is preferentially by modulation of the current through the device. This optical modulation can then be applied to the GaN photoconductive material so as to modulate the resistance of the photoconductive material. Other laser diodes are also possible using this technique. Further, similar techniques can be used to form the Optocondistor modulated by radiation as shown in the alternate figures.

For larger GaN photoconductive material structures, increased laser energy is required. This increased energy can be realized by using a laser "gain medium" and the laser diodes as a pump for such a medium. Although the popular laser mediums are Nd:YAG, emission at about 950 nm can be realized with GaN doped with $Nd^{+3}$. To use Nd:YAG, as it is a glass, would require more classic optical bonding techniques to the substrate such as use of organic adhesives. To use GaN doped $Nd^{+3}$, reactive co-sputtering of the materials can be used and the standard photoresist technique defined above, for defining placement on the common SiC or sapphire substrate.

Figure 6:
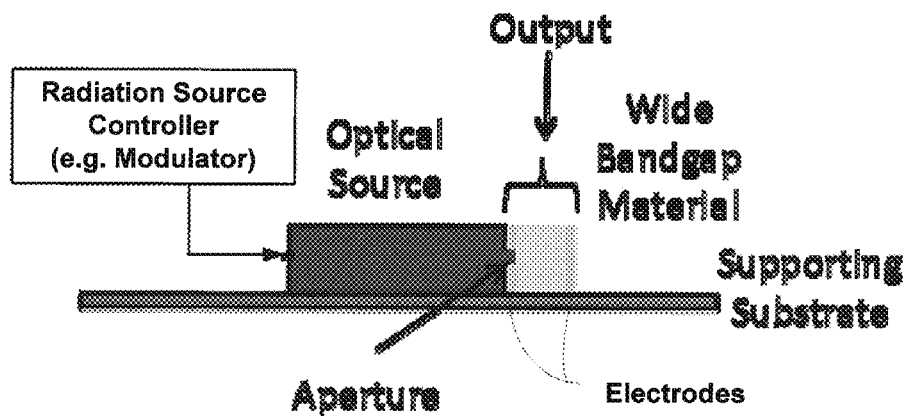
FIG. 6 is a second example embodiment of the opticondistor of the present invention.

FIG. 6 shows a second example embodiment, similar to FIG. 5, but where the electrodes are vertically arranged orthogonal to the WBS substrate so that activation energy from the radiation source is passed through an aperture in the electrode to reach the wide bandgap material. An example method of fabricating an Opticondistor with GaN material and with a vertical electrode configuration, is described as follows. Vertical electrodes can be deposited using 3-d masking techniques. In this approach, the GaN photoconductive material is deposited directly onto a SiC substrate or alternatively sapphire. By applying photoresist by a preferential spray technique and then developing using a "wafer wobble" mechanical means (e.g., the wafer normal is caused to precess relative to the axis of the incident light), proper exposure can be realized on the a 3d structure substantially above the wafer and especially on the vertical faces of deposited GaN photoconductive material. Upon applying the proper reagents, the photoresist on the faces of the GaN photoconductive material can then be removed and coated with a highly conductive material or even be ion implanted to render the faces conductive. Because of the thin film nature of these type of electrodes, they can be essentially highly transparent to the optical energy exciting the crystal, any aperture as shown in the figure is optional.

Figure 7:
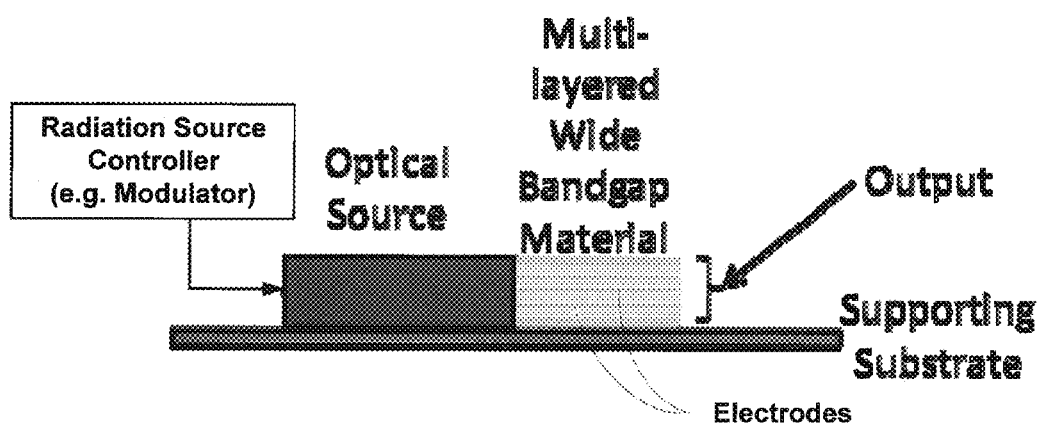
FIG. 7 is a third example embodiment of the opticondistor of the present invention.

In a third example embodiment shown in FIG. 7, the electrodes are arranged parallel with the WBS substrate similar to FIG. 5. However, multiple layers of, for example, alternative WBS and conductive layers, are provided between the end electrodes (to and bottom electrodes) to increase the voltage holding capability for a given thickness. It is well known that voltage breakdown strength of materials increases with decreasing thickness. It is also well known that by laminating materials in thin layers to build up the thickness increases the breakdown strength of a solid material of equivalent thickness. Further, it is well known that placing conductive layers between each lamination also increases the voltage breakdown strength over a solid material of equivalent thickness.

It is notable that the radiation source can be non-optical radiation sources as well as optical sources as depicted above. FIGS. 8-11 are example arrangements and configurations of non-optical, radiation source-based opticondistors.

Figure 8:
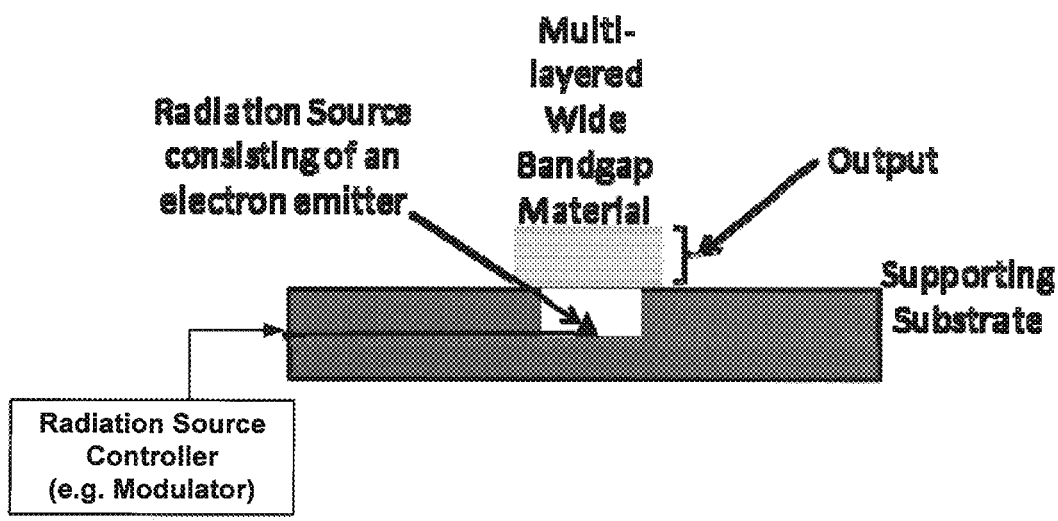
FIG. 8 is a fourth example embodiment of the radiation-controlled transconductance varistor of the present invention.
Figure 9:
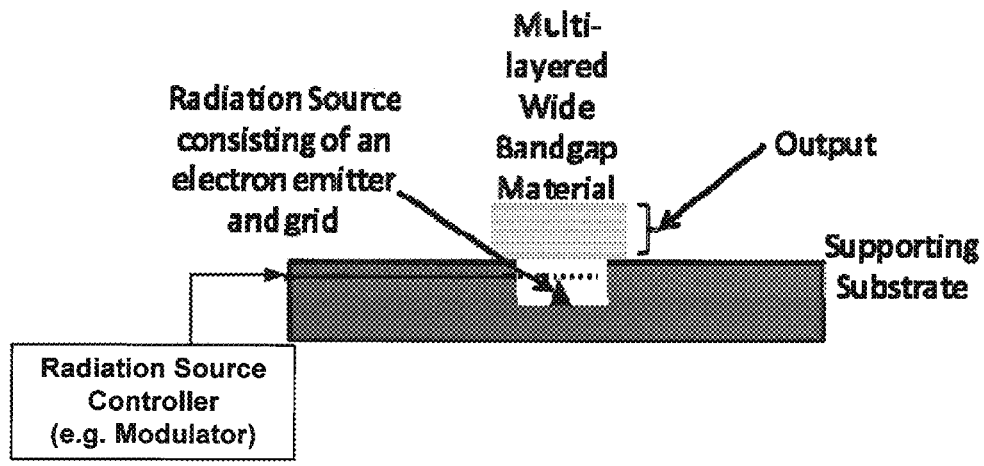
FIG. 9 is a fifth example embodiment of the radiation-controlled transconductance varistor of the present invention.
Figure 10:
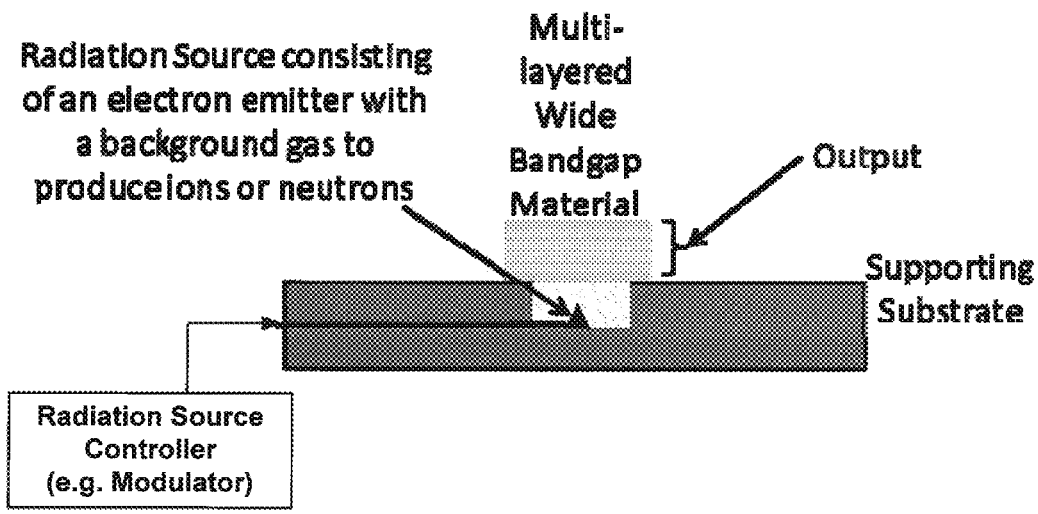
FIG. 10 is a sixth example embodiment of the radiation-controlled transconductance varistor of the present invention.
Figure 11:
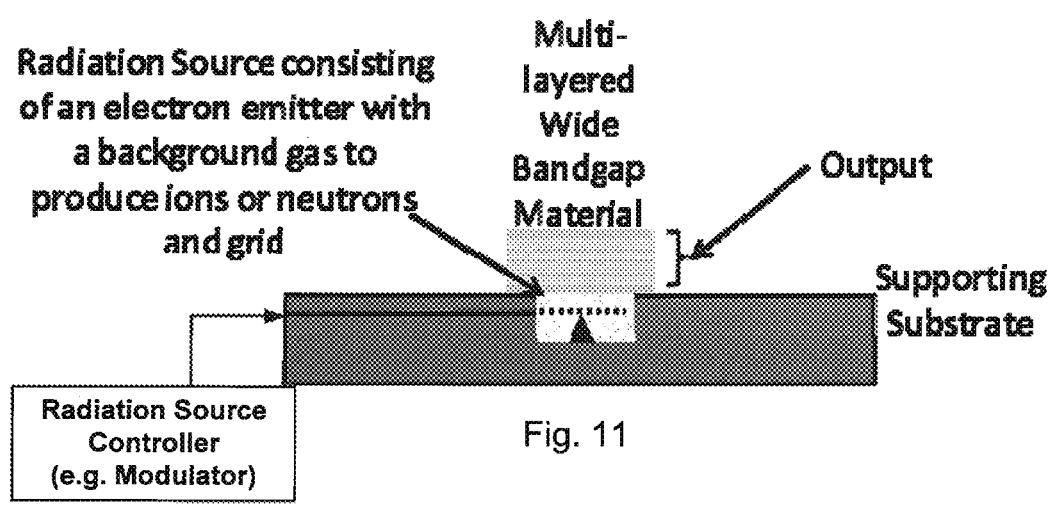
FIG. 11 is a sixth example embodiment of the radiation-controlled transconductance varistor of the present invention.

FIG. 8 shows an electron emitter as the radiation source positioned in a cavity of the substrate, with the multi-layer WBS material formed directly above the cavity and the source. A radiation source controller is shown providing input to the electron emitter. Similar to FIG. 8, FIG. 9 shows an electron emitter grid used as the radiation source, and also positioned adjacent the WBS material in a substrate cavity. In FIG. 10, a similar arrangement to FIGS. 8 and 9 are shown, having as the radiation source an electron emitter with a background gas to produce ions or neutrons. And in FIG. 11, a similar arrangement to FIG. 10 is shown having an electron emitter grid with a background gas to produce ions or neutrons.

Some of the advantages of the above example configurations are as follows: The multiple surface that the radiation encounters are eliminated, thus making the conversion from radiation modulation to electrical modulation substantially more efficient. Attenuation produced by an intermediate optical conduit is obviated, and the concentrating of optical energy in and out of the fiber, risking damage, is avoided. The solid angle that the WBS material intercepts from the optical source is substantially higher without the introduction of added lossy optical surfaces, noting also that the radiation can be more easily trapped by proper shaping and coatings on the wide bandgap material. In materials such as gallium nitride where a substrate is required to grow the material, that substrate can now function as the substrate for the entire assembly thus eliminating the highly intrusive "lift-off" step. And when multiple layers are desired to increase the voltage holding capability for a given thickness, the previous mention advantage of a supporting substrate enables easier multi-layering of the WBS material.

Although the description above contains many details and specifics, these should not be construed as limiting the scope of the invention but as merely providing illustrations of some of the presently preferred embodiments of this invention. Other implementations, enhancements and variations can be made based on what is described and illustrated in this patent document. The features of the embodiments described herein may be combined in all possible combinations of methods, apparatus, modules, systems, and computer program products. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Therefore, it will be appreciated that the scope of the present invention fully encompasses other embodiments which may become obvious to those skilled in the art. In the claims, reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device to address each and every problem sought to be solved by the present invention, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

I claim:

1. A radiation-controlled transconductance varistor comprising:
   a substrate;
   a wide bandgap semiconductor (WBS) material formed on the substrate between two electrodes; and
   a radiation source cable of being controlled by a source controller to produce radiation, said radiation source formed on the substrate adjacent the WBS material so that radiation from the radiation source is transmitted directly to the WBS material to control conductivity thereacross between said electrodes.

2. The radiation-controlled transconductance varistor of claim 1,
   wherein said radiation source and said WBS material are formed abutted against each other so that radiation from the radiation source is transmitted across a radiation source-to-WBS interface directly to the WBS material to control conductivity thereacross between said electrodes.

3. The radiation-controlled transconductance varistor of claim 1,
   wherein said radiation source is formed in a substrate cavity, and the WBS is formed over the substrate cavity.

4. The radiation-controlled transconductance varistor of claim 3,
   wherein said radiation source is selected from a group consisting of an electron emitter and electron emitter grid, with or without a background gas for the production of ions or neutrons.

5. An optically-controlled transconductance varistor comprising:
   a substrate;
   a wide bandgap semiconductor (WBS) material formed on the substrate between two electrodes; and
   an optical source cable of being controlled by a source controller to produce light, said optical source formed on the substrate adjacent the WBS material so that illumination from the optical source is transmitted directly to the WBS material to control conductivity thereacross between said electrodes.

6. The optically-controlled transconductance varistor of claim 5,
   wherein said optical source and said WBS material are formed abutted against each other so that illumination from the radiation source is transmitted across an optical source-to-WBS interface directly to the WBS material to control conductivity thereacross between said electrodes.

\* \* \* \* \*